US008884441B2

(12) United States Patent
Hsueh et al.

(10) Patent No.: US 8,884,441 B2
(45) Date of Patent: Nov. 11, 2014

(54) PROCESS OF ULTRA THICK TRENCH ETCH WITH MULTI-SLOPE PROFILE

(71) Applicant: Taiwan Semiconductor Manufacturing Co., Ltd., Hsin-Chu (TW)

(72) Inventors: Chih-Hung Hsueh, Tainan (TW); Wei-Te Wang, Kaohsiung (TW); Shao-Yu Chen, Tainan (TW); Chun-Liang Fan, Tainan (TW); Kuan-Chi Tsai, Kaohsiung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/769,441

(22) Filed: Feb. 18, 2013

(65) Prior Publication Data

US 2014/0231955 A1 Aug. 21, 2014

(51) Int. Cl.
*H01L 23/48* (2006.01)
*H01L 23/52* (2006.01)
*H01L 29/40* (2006.01)
*H01L 49/02* (2006.01)

(52) U.S. Cl.
CPC .................................... *H01L 28/10* (2013.01)
USPC .... 257/774; 257/649; 257/760; 257/E21.006; 257/E21.027; 257/E21.029; 257/E21.058; 257/E21.059; 257/E21.227; 257/E21.319; 257/E21.304; 257/E21.546

(58) Field of Classification Search
USPC ......... 257/774, 764, 760, 649, 622, 396, 293, 257/146
See application file for complete search history.

(56) References Cited

U.S. PATENT DOCUMENTS

| 6,208,008 | B1 | 3/2001 | Arndt et al. | |
| 8,287,713 | B2 * | 10/2012 | Yoshioka et al. | 205/67 |
| 2004/0097075 | A1 | 5/2004 | Bradshaw et al. | |
| 2009/0261937 | A1 * | 10/2009 | Ko et al. | 336/200 |
| 2009/0321052 | A1 * | 12/2009 | Yoshioka et al. | 165/104.19 |
| 2011/0079811 | A1 | 4/2011 | Lin et al. | |

FOREIGN PATENT DOCUMENTS

| GB | 2365215 A | 2/2002 |
| GB | 2390742 A | 4/2003 |
| JP | 11274158 A | 1/1999 |
| JP | 2001313296 A | 11/2001 |

* cited by examiner

*Primary Examiner* — David Nhu
(74) *Attorney, Agent, or Firm* — Eschweiler & Associates, LLC

(57) ABSTRACT

The present disclosure relates to an integrated chip (IC) having an ultra-thick metal layer formed in a metal layer trench having a rounded shape that reduces stress between an inter-level dielectric (ILD) layer and an adjacent metal layer, and a related method of formation. In some embodiments, the IC has an inter-level dielectric layer disposed above a semiconductor substrate. The ILD layer has a cavity with a sidewall having a plurality of sections, wherein respective sections have different slopes that cause the cavity to have a rounded shape. A metal layer is disposed within the cavity. The rounded shape of the cavity reduces stress between the ILD layer and the metal layer to prevent cracks from forming along an interface between the ILD layer and the metal layer.

13 Claims, 6 Drawing Sheets

PROCESS OF ULTRA THICK TRENCH ETCH WITH MULTI-SLOPE PROFILE

BACKGROUND

Inductors are passive electrical components that are configured to generate a magnetic field that stores energy. Inductors are used in a wide variety of integrated circuit applications including radio frequency (RF) circuits such as low-noise amplifiers, voltage-controlled oscillators, and power amplifiers. Inductors having relatively small values are often built directly on integrated circuits using existing integrated chip fabrication processes. For example, an integrated inductor may be formed using one or more back-end-of-the-line (BEOL) metal interconnect layers.

Inductor designers are commonly interested in an inductance as well as a quality factor (Q-factor) of an integrated inductor. The inductance of an integrated inductor is a measure of an amount of energy stored in an inductor. The Q-factor is a ratio of an amount of energy stored in an inductor to the amount of energy dissipated in the inductor (e.g., an ideal inductor has a high Q-factor).

DETAILED DESCRIPTION

Figure 1A:
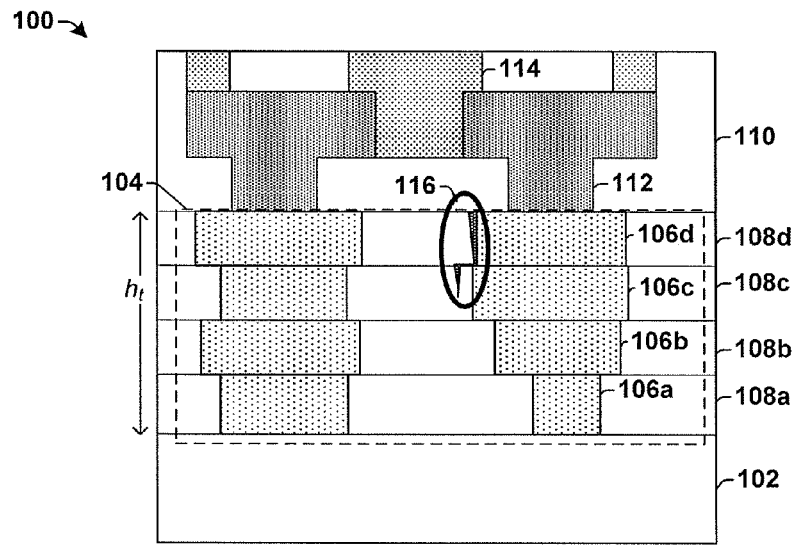
FIG. 1A illustrates a block diagram of an integrated chip having a back-end-of-the-line (BEOL) stack comprising an ultra-thick metal layer.

The present disclosure will now be described with reference to the drawings wherein like reference numerals are used to refer to like elements throughout, and wherein the illustrated structures are not necessarily drawn to scale. It will be appreciated that this detailed description and the corresponding figures do not limit the scope of the present disclosure in any way, and that the detailed description and figures merely provide a few examples to illustrate some ways in which the inventive concepts can manifest themselves.

The quality factor (Q-factor) and inductance of an integrated inductor are limited by the resistance of metal interconnect layers of the integrated inductor. To improve the Q-factor and inductance of an integrated inductor, the resistance of one or more metal interconnect layers within the integrated inductor can be minimized. One way to minimize the resistance of a metal interconnect layer is to increase a thickness (i.e., a height) of the metal interconnect layer. Therefore, integrated inductors may be formed using one or more UTM layers.

For example, FIG. 1A illustrates an exemplary back-end-of-the-line (BEOL) stack 100 comprising an integrated inductor 104. The integrated inductor 104 comprises a plurality of stacked ultra-thick metal (UTM) layers 106a-106d disposed within one or more inter-level dielectric (ILD) layers 108a-108d that are located on a semiconductor substrate 102. The BEOL stack 100 may further comprise an aluminum redistribution layer 112 and/or a passivation layer 114 disposed in an inter-level dielectric layer 110 located above the UTM layers 106a-106d. Collectively, the plurality of stacked UTM layers 106a-106d have a large thickness $h_t$ that provides the integrated inductor 1-4 with a low resistance.

Figure 1B:
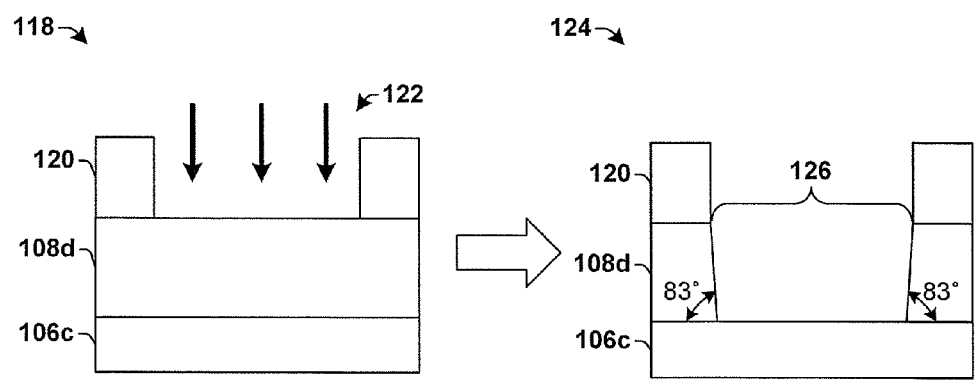
FIG. 1B illustrates cross-sectional views showing the formation of a conventional ultra-thick metal layer.

FIG. 1B illustrates cross-sectional views 118 and 124 showing the formation of an ultra-thick metal layer (e.g., 106d). As shown in cross sectional view 118, the UTM layer (e.g., 106d) is formed by depositing an ILD layer 108d above an underlying UTM layer 106c. A masking layer 120 is formed above the ILD layer 108d, which is subsequently exposed to an etchant 122 that forms a metal layer trench 126 by selectively etching the ILD layer 108d, as shown in cross-sectional view 124. The resulting metal layer trench 126 has sidewalls that form a nearly vertical sidewall angle (e.g., an angle of approximately 83° with respect to the underlying UTM layer 106c).

The substantially vertical sidewall and large height of the metal layer trench (e.g., greater than 1 um) induce a high stress between the UTM layer 106d and the adjacent ILD layer 108d. The high stress causes the UTM layer 106d to suffer worse crack defect than metal layers having a typical height (e.g., 100 nm-500 nm). For example, the high stress may cause cracks 116 to form between a UTM layer 106d and adjacent ILD layer 108d, as shown in FIG. 1A.

Accordingly, the present disclosure relates to an integrated chip (IC) having an ultra-thick metal layer formed in a metal layer trench having a rounded shape that reduces stress between an inter-level dielectric (ILD) layer and an adjacent metal layer, and a related method of formation. In some embodiments, the IC comprises an inter-level dielectric (ILD) layer disposed above a substrate. The ILD layer has a cavity with a sidewall comprising a plurality of sections, where respective sections have different slopes that cause the cavity to have a rounded shape. An ultra-thick metal layer is disposed within the cavity. The rounded shape of the cavity reduces stress between the ILD layer and the ultra-thick metal layer, thereby mitigating crack formation along an interface between the ILD layer and the ultra-thick metal layer.

Figure 2:
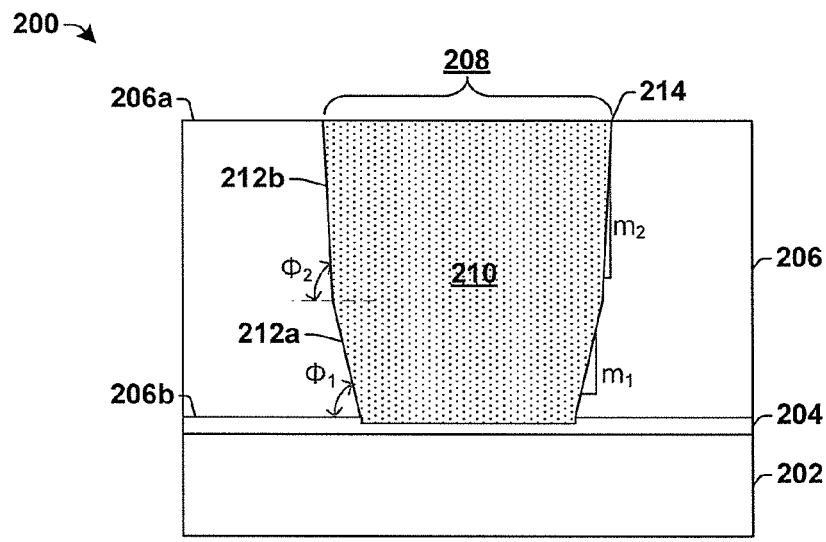
FIG. 2 illustrates a cross-sectional view of some embodiments of a disclosed ultra-thick metal layer.

FIG. 2 illustrates a cross-sectional view of some embodiments of an integrated chip 200 comprising a disclosed ultra-thick metal layer 210.

The integrated chip 200 comprises an inter-level dielectric (ILD) layer 206 disposed above a substrate 202. In some embodiments, the substrate 202 may comprise an underlying metallization layer (e.g., an underlying UTM copper layer). In other embodiments, the underlying substrate 202 may comprise a semiconductor substrate (e.g., a silicon substrate), an epitaxial layer, or some other substrate. In various embodiments, the ILD layer 206 may comprise an oxide, a low-k dielectric material (e.g., silicon carbon oxide (SiCo)), or an ultra low-k dielectric material. In some embodiments, an etch stop layer 204 (e.g., a silicon nitride layer) is disposed between the ILD layer 206 and the substrate 202.

The ILD layer 206 has a cavity 208 that extends from a top surface of the ILD layer 206a to a bottom surface of the ILD layer 206b. In various embodiments, the cavity 208 may have a height of greater than 1 um. An ultra-thick metal (UTM) layer 210 is disposed within the cavity 208. In some embodiments, the UTM layer 210 comprises a copper metal having a height of greater than 1 um.

The cavity 208 has sidewalls comprising a plurality of different sections (e.g., 2 sections, 3 sections, 4 sections, etc.). The plurality of different sections have different slopes, so as to provide a multi-sloped profile for the sidewalls. For example, cavity 208 has a sidewall comprising a lower, first section 212a having a first slope $m_1$ and an upper, second section 212b having a second slope $m_2$. The different slopes, $m_1$ and $m_2$, cause the sidewall to have a plurality of sidewall angles (i.e., angles measured with respect to the semiconductor substrate) that are separated by an angular difference of greater than 5°. For example, the first section 212a may have a first sidewall angle $\Phi_1=66°$, while the second section 212b may have a second sidewall angle $\Phi_2=73°$.

The slopes of the different sections of the sidewall increase as a distance between the substrate 202 and a section increase. For example, the slope $m_2$ of the second section 212b is larger than the slope $m_1$ of the first section 212a. Increasing the slope of the sidewalls sections as the sections get higher gives the cavity 208 a rounded shape having a curvature that curves away from the substrate 202 as a radius of the cavity 208 increases. The rounded shape of the cavity 208 reduces stress along an interface between the ILD layer 206 and the UTM layer 210 to mitigate crack formation along an interface between the ILD layer 206 and the UTM layer 210.

Figure 3A:
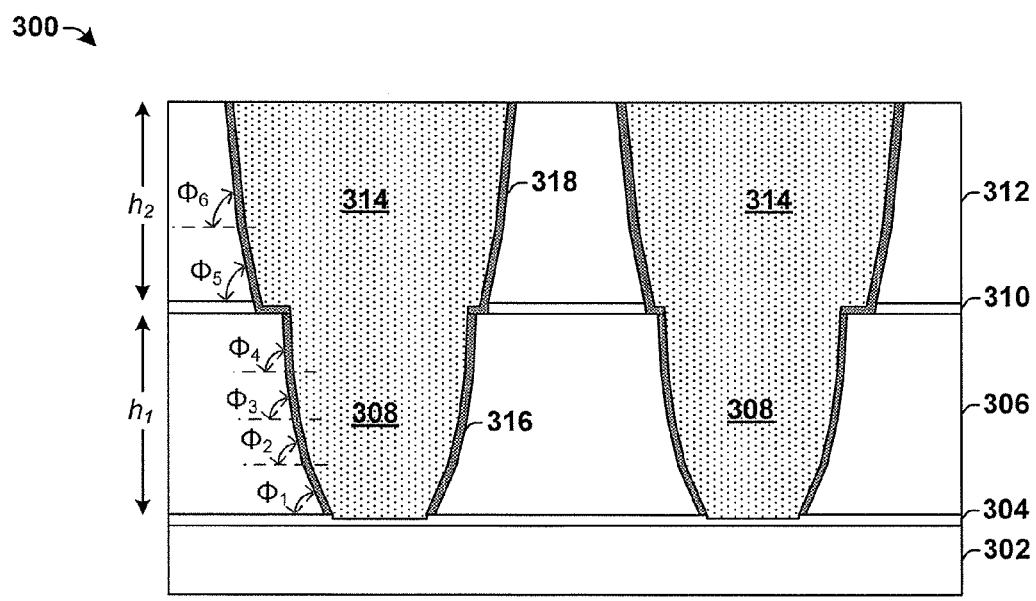
FIGS. 3A-3B illustrate some embodiments of a BEOL stack with an integrated inductor comprising a plurality of disclosed ultra-thick metal layers.
Figure 3B:
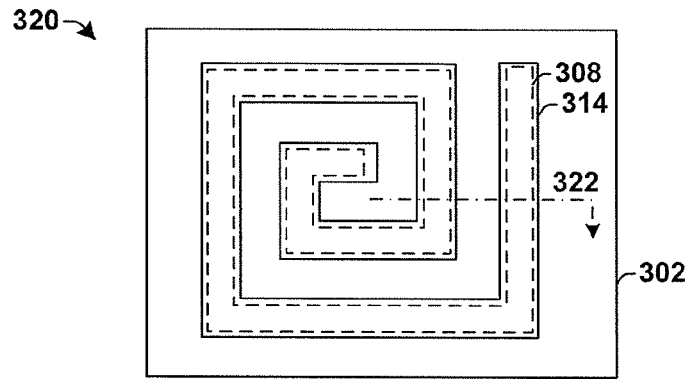

FIGS. 3A-3B illustrate some embodiments of an integrated chip having a back-end-of-the-line (BEOL) stack comprising an integrated inductor having a plurality of stacked ultra-thick metal layers 308 and 314.

FIG. 3A illustrates a cross-sectional view of some embodiments of an integrated chip 300 having a BEOL stack comprising a plurality of ultra-thick metal layers.

The integrated chip 300 comprises a semiconductor substrate 302 (e.g., a silicon substrate). A first etch stop layer 304 may be disposed above the semiconductor substrate 302. In various embodiments, the first etch stop layer 304 may comprise a silicon nitride (SiN) layer, a silicon carbide (SiC) layer, a silicon oxycarbide (SiOC) layer, or some other similar etch stop layer.

A first ultra-thick metal (UTM) layer 308 is disposed within a first inter-level dielectric (ILD) layer 306 located above the semiconductor substrate 302. The first UTM layer 308 is disposed within a cavity in the first ILD layer 306 that comprises a sidewall having four sections. The first section has a first slope that forms a first sidewall angle $\Phi_1$ (i.e., an angle with respect to the semiconductor substrate), the second section has a second slope that forms a second sidewall angle $\Phi_2$, the third section has a third slope that forms a third sidewall angle $\Phi_3$, and the fourth section has a fourth slope that forms a fourth sidewall angle $\Phi_4$. In some embodiments, the first UTM layer 308 has a first height $h_1$ having a range of between approximately 1 um and approximately 10 um.

A second ultra-thick metal (UTM) layer 314 is disposed within a second inter-level dielectric (ILD) layer 312 located above the first ILD layer 306. In some embodiments, a second etch stop layer 310 is disposed between the first ILD layer 306 and the second ILD layer 312. The second (UTM) layer 314 is disposed within a cavity in the second ILD layer 312 that comprises a sidewall having two sections. The first section has a first slope that forms a first sidewall angle $\Phi_5$ and the second section has a second slope that forms a second sidewall angle $\Phi_6$. In some embodiments, the second UTML layer 314 has a second height $h_2$ having a range of between approximately 1 um and approximately 10 um.

In some embodiments, a titanium barrier layer is disposed between the inter-level dielectric layers, 306 and 312, and adjacent UTM layers, 308 and 314 respectively. For example, a first titanium barrier layer 316 may be disposed between the first ILD layer 306 and the first UTM layer 308, and a second titanium barrier layer 318 may be disposed between the second ILD layer 312 and the second UTM layer 314. In some embodiments, the titanium barrier layers, 316 and 318, may have a thickness in a range of between approximately 100 angstroms and approximately 2000 angstroms. The titanium barrier layers, 316 and 318, prevent diffusion of metal particles from a UTM layer to an adjacent ILD layer. The titanium barrier layers, 316 and 318, also improve adhesion between a UTM layer and an adjacent ILD layer.

FIG. 3B illustrates a top-view 320 of some embodiments of integrated chip 300. As shown in top-view 320, the first and second UTM layers, 308 and 314, are stacked onto one another to form a conductive structure having a height that is equal to a sum of the first height $h_1$ and the second height $h_2$. In some embodiments, the first and second UTM layers, 308 and 314, may be laid out in a spiral coil pattern that concentrates the magnetic flux induced by a current flowing through the first and second UTM layers, 308 and 314, to store energy within the integrated inductor. The cross-sectional line 322 corresponds to the cross-sectional view shown in FIG. 3A.

Figure 4:
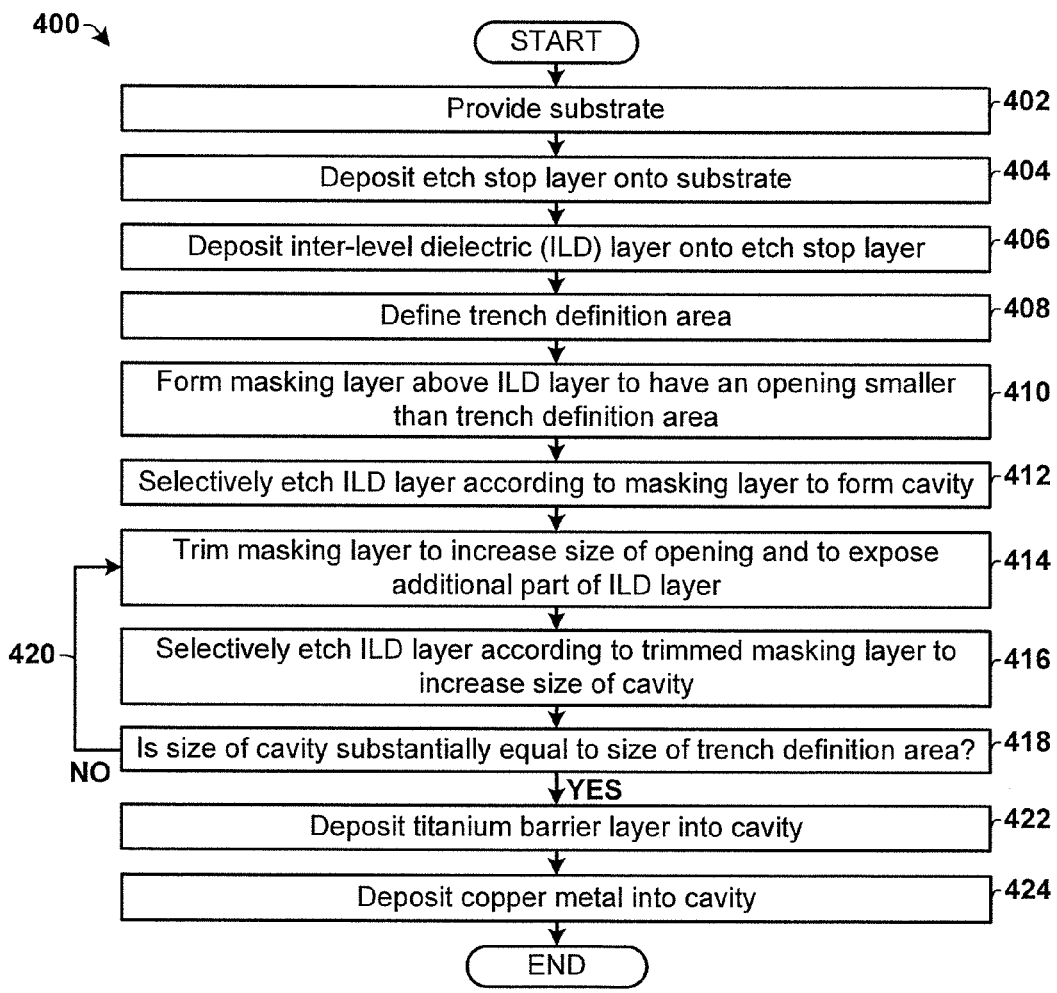
FIG. 4 is a flow diagram illustrating some embodiments of a disclosed method of forming an ultra-thick metal layer.

FIG. 4 is a flow diagram illustrating some embodiments of a disclosed method 400 of forming an ultra-thick metal (UTM) layer.

It will be appreciated that while the disclosed method 400 is illustrated and described as a series of acts or events, that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

At act 402, a substrate is provided. In various embodiments, the substrate may comprise a semiconductor substrate (e.g., a silicon substrate), an underlying metallization layer formed above a semiconductor substrate (e.g., an underlying copper metal layer), an epitaxial layer, or some other substrate.

At act 404, an etch stop layer is deposited onto the substrate.

At act 406, an inter-level dielectric (ILD) layer is deposited above the substrate at a position on the etch stop layer.

At act 408, a trench definition area is defined. The trench definition area is an area of a metal layer trench within in the ILD layer. For example, a copper oxide trench having a width of 40 nm would have a trench definition area that having a width of approximately 40 nm.

At act 410, a masking layer is selectively formed above the ILD layer. The masking layer forms an opening that exposes the ILD layer. The opening has a size that is smaller than the trench definition area. In some embodiments, the masking layer comprises a photoresist layer spun on the substrate at a high rotational speed and then lithographically patterned to form a masking layer that selectively masks the ILD layer. In some embodiments, an anti-reflective coating (ARC) film may be deposited onto the ILD layer prior to the formation of the masking layer.

At act 412, the ILD layer is selectively etched according to the masking layer to form a cavity. Etching the ILD layer according to the masking layer removes a part of the ILD layer in areas in which the opening exposes the ILD layer to form a cavity having a first size less than the size of the trench definition area.

At act 414, the masking layer is trimmed. Trimming the masking layer reduces the size of the masking layer and increases the size of the opening that exposes the ILD layer, thereby exposing an additional part of the underlying ILD layer.

At act 416, the ILD layer is selectively etched according to the trimmed masking layer. Etching the ILD layer according to the trimmed masking layer removes an additional part of the ILD layer in areas in which the ILD layer is exposed increasing the size of the cavity. It also results in a sidewall of the cavity having an additional section with a slope (and sidewall angle) that is different than that of other sections.

In some embodiments, at act 418, the method 400 may determine if the size of the cavity is substantially equal to the size of the trench definition area. If the size of the cavity is substantially equal to the size of the trench definition area, the method proceeds to act 422. If the size of the cavity is not substantially equal to the size of the trench definition area, the method proceeds to act 414 (via 420), wherein the masking layer is trimmed again (at act 414) to expose an additional part of the ILD layer.

It will be appreciated that acts 414-418 may be iteratively repeated to incrementally increase a size of the cavity until the size of the cavity is substantially equal to the trench definition area. Each time that the ILD layer is etched (e.g., at act 416) an additional section will be formed in a sidewall of the cavity, where the additional section has a sidewall angle that is different than a sidewall angle of the other sections by an angular difference of great than 5°. Once the size of the cavity is substantially equal to the size of the trench definition area any remainder of the masking layer or the anti-reflective coating (ARC) film may be removed.

At act 422, a titanium barrier layer is deposited within the cavity.

At act 424, a metal is deposited within the cavity to form an ultra-thick metal (UTM) layer. The UTM layer has a height that is greater than 1 um.

FIGS. 5-8 illustrate cross-sectional views of some embodiments of an exemplary semiconductor wafer, whereon method 400 is implemented. Although FIGS. 5-8 are described in relation to a method, it will be appreciated that the structures disclosed in FIGS. 5-8 are not limited to such a method. Rather, it will be appreciated that the illustrated structures of FIGS. 5-8 provide for a structural description of a disclosed single wafer cleaning tool that is able to stand alone independent of a method of formation.

Figure 5:
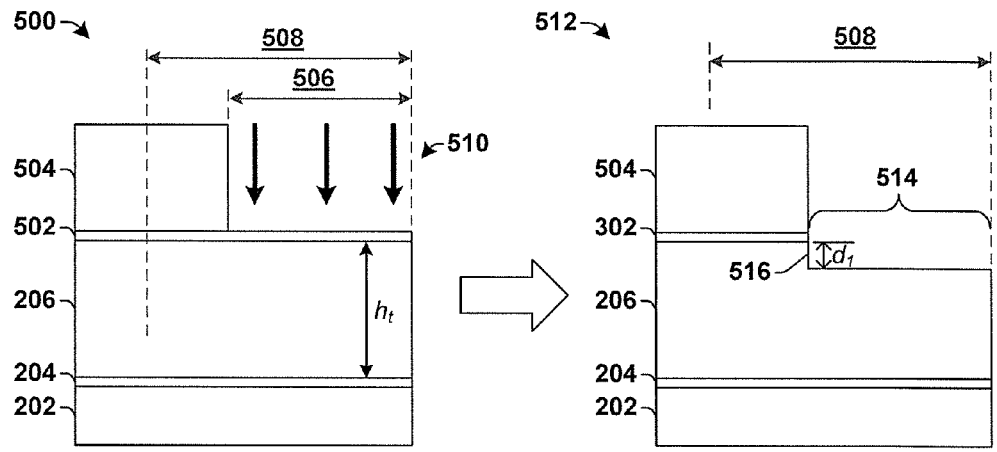
FIGS. 5-8 illustrate cross-sectional views of some embodiments of an exemplary semiconductor substrate, whereon method of FIG. 4 is implemented.

FIG. 5 illustrates some embodiments of cross-sectional views, 500 and 512, corresponding to acts 402-412. As shown in cross-sectional view 500, an etch stop layer 204 is formed above an underlying substrate 202. In various embodiments, the etch stop layer 204 may comprise silicon nitride (SiN), silicon carbide (SiC), or silicon oxycarbide (SiOC) deposited by a deposition process (e.g., a physical vapor deposition (PVD) process, a chemical vapor deposition (CVD) process, etc.) performed in a processing chamber held under vacuum.

An inter-level dielectric (ILD) layer 206, having a thickness of $h_t$, is formed above the etch stop layer 204. In various embodiments, the ILD layer 206 may comprise an oxide, a low-k dielectric material, or an ultra low-k (ULK) dielectric material formed onto the etch stop layer 204 by vapor deposition or by spin coating.

A masking layer 504 is formed above the layer 206. The masking layer 504 has an opening 506 that exposes the underlying ILD layer 206 in a part of a trench definition area 508 (which defines an area of a trench used to make a metal layer). In some embodiments, the masking layer 504 comprises a photoresist layer spun onto the substrate at a position above the ILD layer 206. In such embodiments, an anti-reflective coating (ARC) film 502 may be formed between the ILD layer 206 and the photoresist layer. The ARC film 502 improves photolithographic processing of the overlying photoresist (e.g., enables fine resolution of photoresist features).

The ILD layer 206 is selectively exposed to an etchant 510 according to the opening 506 in the masking layer 504. In various embodiments, the etchant 510 may comprise a dry etchant having a chemistry comprising $CHF_2$, $SF_6$ or $CHF_3$ mixed with $O_2$. As shown in cross-sectional view 512, the etchant 510 removes a part of the ILD layer 206 to form a cavity 514 having a depth $d_1$. The cavity has a sidewall 516 with a single section.

Figure 6:
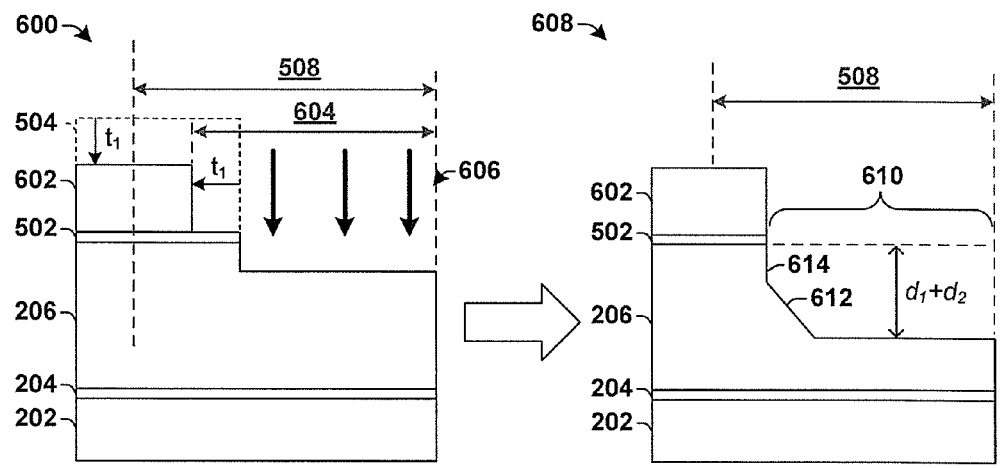

FIG. 6 illustrates some embodiments of cross-sectional views, 600 and 606, corresponding to acts 414-416. In cross-sectional view 600, masking layer 504 is trimmed to form a masking layer 602. Masking layer 602 has a height and width reduced by a value $t_1$ with respect to masking layer 504. In some embodiments, masking layer 504 is trimmed by exposing the masking layer 504 to a first etchant. For example, a photoresist masking layer may be trimmed by exposing the photoresist to a first etchant comprising a dry etchant having a chemistry comprising $O_2$, for example. Masking layer 602 has an opening 604 that exposes an additional area of the ILD layer 206.

The ILD layer 206 is selectively exposed to a second etchant 606 (e.g., having a chemistry comprising $CHF_2$, $SF_6$ or $CHF_3$ mixed with $O_2$) according to the opening 604 in the masking layer 602. As shown in cross-sectional view 608, the second etchant 606 removes an additional part of the ILD layer 206 to form a cavity 610 having a maximum depth $d_1+d_2$. The cavity 610 has a multi-sloped sidewall, which has a first section 612 having a first slop $m_1$ and a second section 614 having a different, second slope $m_2$.

Figure 7:
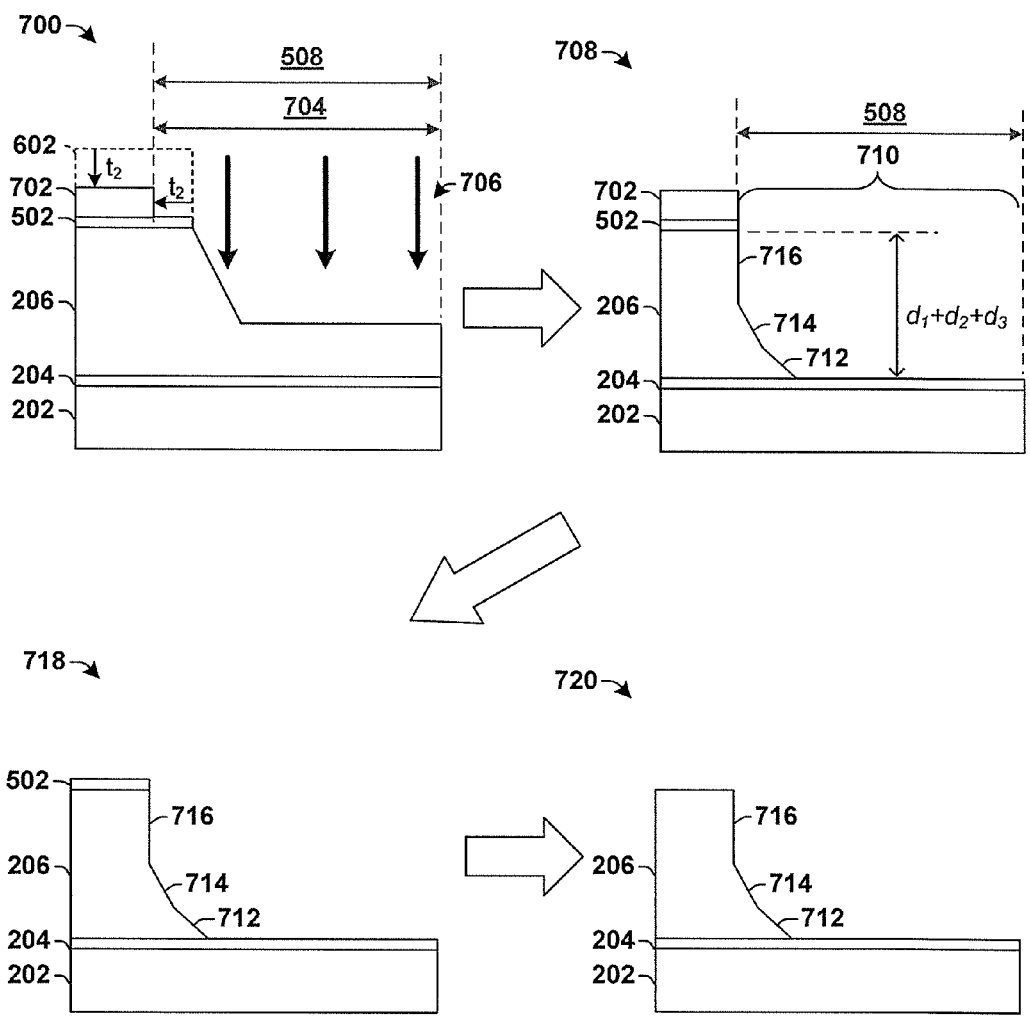

FIG. 7 illustrates some embodiments of cross-sectional views 700, 708, 718, and 720 corresponding to acts 418-420. As shown in cross-sectional view 700, since the size of cavity 610 is not substantially equal to the trench definition area 508, masking layer 602 is trimmed to form a masking layer 702 having a height and width reduced by a value $t_2$ with respect to masking layer 602, as shown in cross-sectional view 700. In some embodiments, masking layer 602 is trimmed to form masking layer 702 by exposing the masking layer 602 to a first etchant that etches away the masking layer 602 along a first direction and a second direction to form an opening 704 that exposes an additional area of the ILD layer 206.

The ILD layer 206 is selectively exposed to a second etchant 706 (e.g., having a chemistry comprising $CHF_2$, $SF_6$ or $CHF_3$ mixed with $O_2$) according to the opening 704 in the masking layer 702. As shown in cross-sectional view 708, the second etchant 706 removes an additional part of the ILD layer 206 to form a cavity 710 having a maximum depth of $d_1+d_2+d_3$ (wherein $d_1+d_2+d_3>1$ um). The cavity 710 has a multi-sloped sidewall, which has a first section 712 with a slope m1', a second section 714 with a slope m2', and a third section 716 with a slope m3, where m1', m2', and m3 are different.

Since the size of cavity 710 is substantially equal to the trench definition area 508, the remainder of the masking layer 702 is removed, as shown in cross sectional view 718. In some embodiments, a photoresist ashing process may be performed to remove a remainder of a masking layer 702 comprising a photoresist layer. The ARC film 502 may also be removed by way of an etching process, as shown in cross-sectional view 720.

Figure 8:
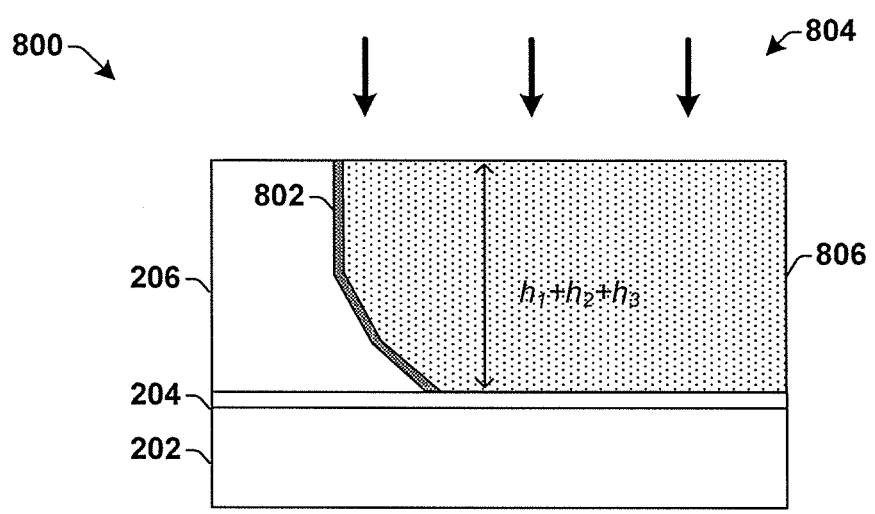

FIG. 8 illustrates some embodiments of a cross-sectional view 800 corresponding to acts 422-424. As shown in cross-sectional view 800, titanium may be deposited within the cavity to from a titanium barrier layer 802 located on the ILD layer 206. In some embodiments, the titanium barrier layer 802 may be deposited by way of a vapor deposition to a thickness in a range of between approximately 100 angstroms and approximately 2000 angstroms. A metal material 804 (e.g., copper) is deposited into the cavity above the titanium barrier layer 802. The metal material 804 is deposited to a depth that fills the cavity. In some embodiments, the metal material 804 may be deposited by way of a vapor deposition. A chemical mechanical polishing (CMP) process is then performed to remove excess metal from the substrate, resulting in an ultra-thick metal layer 806 having a planar top surface.

Although the disclosure has been shown and described with respect to a certain aspect or various aspects, equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the disclosure. In addition, while a particular feature of the disclosure may have been disclosed with respect to only one of several aspects of the disclosure, such feature may be combined with one or more other features of the other aspects as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

Therefore, the present disclosure relates to an ultra-thick metal layer formed in a metal layer trench having a rounded shape that reduces stress between an inter-level dielectric ILD layer and an adjacent metal layer, and a related method of formation In some embodiments, the present disclosure relates to an integrated chip. The integrated chip comprises an inter-level dielectric layer disposed above a substrate and having a cavity with a sidewall comprising a plurality of sections, wherein respective sections have different slopes that cause the cavity to have a rounded shape. The integrated chip further comprises an ultra-thick metal layer disposed within the cavity, wherein the rounded shape of the cavity reduces stress between the inter-level dielectric layer and the ultra-thick metal layer, thereby mitigating crack formation along an interface between the inter-level dielectric layer and the ultra-thick metal layer.

In other embodiments, the present disclosure relates to an integrated chip. The integrated chip comprises an inter-level dielectric layer disposed above a substrate and having a cavity with a sidewall comprising a plurality of sections, wherein the plurality of sections form sidewall angles with respect to the substrate that increase as a distance of a section from the substrate increases, thereby giving the cavity a rounded shape. The integrated chip further comprises an ultra-thick copper metal layer disposed within the cavity, wherein the rounded shape of the cavity reduces stress between the inter-level dielectric layer and the ultra-thick copper metal layer, thereby mitigating crack formation along an interface between the inter-level dielectric layer and the ultra-thick copper metal layer.

In other embodiments, the present disclosure relates to a method of forming an ultra-thick metal layer. The method comprises depositing an inter-level dielectric layer above a substrate and forming a masking layer above the inter-level dielectric layer, wherein the masking layer has an opening that exposes the inter-level dielectric layer. The method further comprises selectively etching the inter-level dielectric layer according to the masking layer to form a cavity having a depth less than a height of the inter-level dielectric layer. The method further comprises trimming the masking layer to increase a size of the opening, thereby exposing an additional area of the inter-level dielectric layer. The method further comprises selectively etching the inter-level dielectric layer according to the trimmed masking layer to increases a depth of the cavity and to form a sidewall of the cavity that comprises a plurality of sections, wherein respective sections have different slopes that cause the cavity to have a rounded shape. The method further comprises depositing a metal material into the cavity to form the ultra-thick metal layer.

What is claimed is:

1. An integrated chip (IC) having an ultra-thick metal layer, comprising:
    an inter-level dielectric layer disposed above a substrate and having a cavity with a sidewall comprising a plurality of sections, wherein respective sections have different slopes that cause the cavity to have a rounded shape; and
    an ultra-thick metal layer disposed within the cavity, wherein the rounded shape of the cavity reduces stress between the inter-level dielectric layer and the ultra-thick metal layer.

2. The integrated chip of claim 1, wherein the plurality of sections comprise:
    a first section having a first slope; and
    a second section, located at a greater distance from the substrate than the first section, and having a second slope that is larger than the first slope.

3. The integrated chip of claim 1,
    wherein the different slopes produce different sidewall angles between the plurality of sections and the substrate; and
    wherein the different sidewall angles are separated by an angular difference of greater than 5°.

4. The integrated chip of claim 1, wherein the ultra-thick metal layer comprises copper.

5. The integrated chip of claim 1, wherein the ultra-thick metal layer has a height of greater than 1 micron.

6. The integrated chip of claim 1, further comprising:
    a titanium barrier layer disposed between the inter-level dielectric layer and the ultra-thick metal layer.

7. The integrated chip of claim 1, wherein the inter-level dielectric layer comprises oxide.

8. The integrated chip of claim 1, wherein the ultra-thick metal layer is part of an integrated inductor.

9. An integrated chip (IC) having an ultra-thick copper metal layer, comprising:
    an inter-level dielectric layer disposed above a substrate and having a cavity with a sidewall comprising a plurality of sections, wherein the plurality of sections form sidewall angles with respect to the substrate that increase as a distance of a section from the substrate increases, thereby giving the cavity a rounded shape; and
    an ultra-thick copper metal layer disposed within the cavity, wherein the rounded shape of the cavity reduces stress between the inter-level dielectric layer and the ultra-thick copper metal layer.

10. The integrated chip of claim 9, wherein the sidewall angles are separated by an angular difference of greater than 5°.

11. The integrated chip of claim 9, wherein the ultra-thick copper metal layer has a height of greater than 1 micron.

12. The integrated chip of claim 9, further comprising:
a titanium barrier layer disposed between the inter-level dielectric layer and the ultra-thick copper metal layer.

13. The integrated chip of claim 9, wherein the inter-level dielectric layer comprises oxide.

\* \* \* \* \*